US009236409B2

(12) United States Patent
Aleksić

(10) Patent No.: US 9,236,409 B2
(45) Date of Patent: Jan. 12, 2016

(54) BINARY PIXEL CIRCUIT ARCHITECTURE

(71) Applicant: Rambus Inc., Sunnyvale, CA (US)

(72) Inventor: Marko Aleksić, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 216 days.

(21) Appl. No.: 13/961,842

(22) Filed: Aug. 7, 2013

(65) Prior Publication Data

US 2014/0054446 A1 Feb. 27, 2014

Related U.S. Application Data

(60) Provisional application No. 61/692,636, filed on Aug. 23, 2012.

(51) Int. Cl.
| | |
|---|---|
| *H01L 27/146* | (2006.01) |
| *H04N 5/335* | (2011.01) |
| *H04N 5/3745* | (2011.01) |

(52) U.S. Cl.
CPC ........ *H01L 27/14609* (2013.01); *H04N 5/3355* (2013.01); *H04N 5/37455* (2013.01)

(58) Field of Classification Search
CPC .................................................... H04N 3/155
USPC ........................................ 250/208.1; 348/308
See application file for complete search history.

(56) References Cited

U.S. PATENT DOCUMENTS

| | | | |
|---|---|---|---|
| 7,750,281 B2 | 7/2010 | Asaba et al. | |
| 2009/0101798 A1 | 4/2009 | Yadid-Pecht et al. | |
| 2014/0313387 A1* | 10/2014 | Vogelsang et al. | ............ 348/308 |
| 2015/0021461 A1 | 1/2015 | Nishihara et al. | |

OTHER PUBLICATIONS

Chung, Meng-Ting et al., "A 0,5V 4.95uW 11.8fps PWM CMOS Imager with 82dB Dynamic Range and 0.055% Fixed-Pattern Noise," 2012 IEEE International Solid-State Circuits Conference Digest of Technical Papers (ISSCC), Feb. 19-23, 2012, pp. 114-116. 3 pages.

Maricic, Danijel, "Image Sensors Employing Oversampling Sigma-Delta Analog-to-Digital Conversion with High Dynamic Range and Low Power," 2011 Thesis submitted to the Department of Electrical and Computer Engineering of the University of Rochester in Rochester, NY. 136 pages.

* cited by examiner

*Primary Examiner* — Renee D Chavez
(74) *Attorney, Agent, or Firm* — Fenwick & West LLP

(57) ABSTRACT

An integrated-circuit image sensor that includes an array of pixel regions composed of binary pixel circuits. Each binary pixel circuit includes a binary amplifier having an input and an output. The binary amplifier generates a binary signal at the output in response to whether an input voltage at the input exceeds a switching threshold voltage level of the binary amplifier. A light-detecting element of the binary pixel circuit is coupled to the input of the binary amplifier. Initialization circuitry of the binary pixel circuit is coupled to the input of the binary amplifier. The initialization circuitry sets the input voltage to a level that is offset relative to the switching threshold voltage level of the binary amplifier by an offset voltage amount, the offset voltage amount representing a threshold amount of light incident on the light detecting element.

20 Claims, 8 Drawing Sheets

BINARY PIXEL CIRCUIT ARCHITECTURE

CROSS REFERENCE TO RELATED APPLICATIONS

This application claims the benefit of and priority to U.S. Provisional Patent Application No. 61/692,636, titled "Binary Pixel Circuit Architecture" and filed on Aug. 23, 2012, the contents of which are incorporated by reference herein in their entirety.

TECHNICAL FIELD

The present disclosure relates to electronic image sensors, and more specifically to binary pixel image sensors.

BACKGROUND

An image sensor is a device that converts light into electronic signals for producing an image. One specific type of image sensor is the binary pixel image sensor that uses binary circuits to convert detected light into binary logic values. Binary pixel image sensors can offer improved dynamic range over conventional analog image sensors. However, binary pixel image sensors, like traditional analog sensors, can be susceptible to random device noise and fixed pattern noise caused by mismatches across the pixels, which can affect the quality of an image produced by the binary pixel image sensor.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Embodiments of the present disclosure relate to a binary pixel image sensor. The binary pixel image sensor includes pixel regions composed of binary pixel circuits. Each binary pixel circuit includes a light-detecting element (e.g. a photodiode), a binary amplifier, and initialization circuitry. The binary amplifier has an input and an output. The light-detecting element is coupled to an input of the binary amplifier and the binary amplifier generates a binary signal at the output in response to whether an input voltage at its input exceeds a switching threshold voltage level of the binary amplifier. The initialization circuitry is also coupled to the input of the binary amplifier. The initialization circuitry sets the input voltage to a level that is offset relative to the switching threshold voltage level. An amount of the offset represents a voltage difference that corresponds to a threshold amount of light incident on the light-detecting element. Beneficially, both the structure and operation of the binary pixel in at least some of the described embodiments increases the immunity of the binary pixel image sensor to random noise and fixed pattern noise across the binary pixel image sensor, as will be explained herein.

Reference is now made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
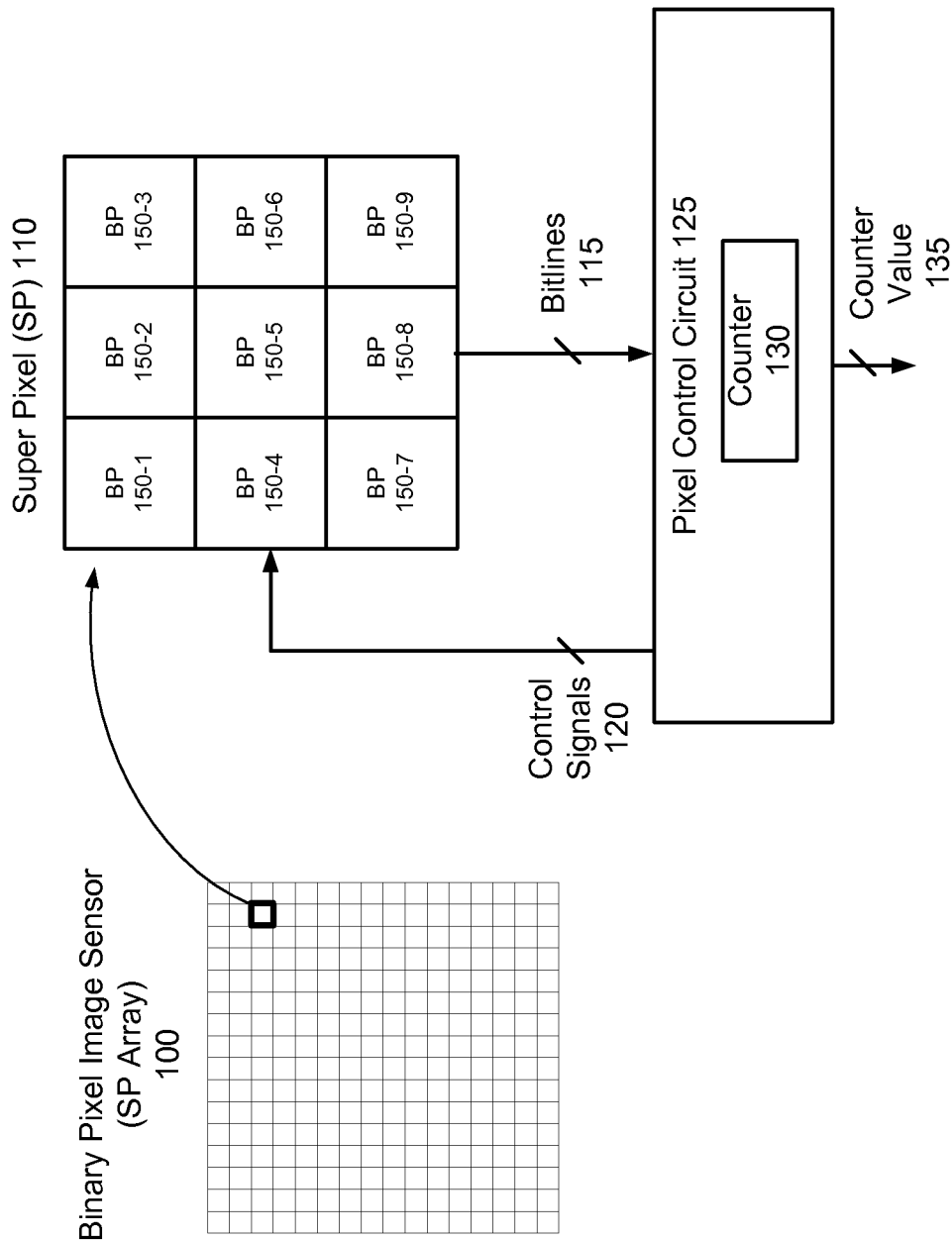
FIG. 1 is a binary pixel image sensor, according to an embodiment.

FIG. 1 is a binary pixel image sensor 100, according to an embodiment. The binary pixel image sensor 100 is formed by an array of pixel regions referred to herein as super pixels (SP) 110. Each SP 110 is akin to a single pixel of a conventional analog image sensor. Each SP 110 is formed by a cluster of one or more binary pixel circuits (BP) 150, for example organized into rows and columns. Each BP 150 outputs a one-bit binary signal that indicates whether a threshold amount of light has been detected since the BP 150 was last initialized. For example, a BP 150 outputting a digital signal having a value of "0" can indicate that the threshold amount of light has not yet been detected, and a BP 150 outputting a digital signal having a value of "1" can indicate that the threshold amount of light has been detected.

The pixel control circuit 125 controls each BP 150 within a SP 110 via one or more control signals 120. Through the control signals 120, the pixel control circuit 125 can initialize the BP 150 by resetting the BP 150 and then introducing a voltage offset to the BP 150 that represents the threshold amount of light to be detected by each BP 150. The control signals 120 can include, for example, row selection signals for selecting a row of the BPs 150, column selection signals for selecting a column of the BPs 150, reset signals, as well as other types of control signals as will be described herein. In one embodiment the pixel control circuit 125 may control the BPs 150 of more than one SP 110.

After initialization, each BP 150 accumulates light during an exposure interval of the BP 150. At the conclusion of the exposure interval for a particular BP, the pixel control circuit 125 samples the digital signal output of that BP via one of the bitlines 115. The pixel control circuit 125 may also include counter 130 to track the total (or partial over a fraction of an overall image exposure time) value of the binary signals output by each BP of a SP. The process of exposing the BPs 150 to light, sampling the values of the BPs 150, re-initializing a BP when/if the BP passes its binary threshold and then increasing the aggregate count value of the BPs 150 can be performed several times to yield a multi-bit counter value 135 that represents a total amount of light incident on the SP 110 for an overall image exposure time.

In one embodiment, the pixel control circuit 125 re-initializes a BP 150 in response to the BP 150 outputting a digital signal indicating that the threshold amount of light has been detected. In another embodiment, the pixel control circuit 125 re-initializes a BP 150 at periodic intervals, e.g., at each readout, regardless of the digital signal output by the BP 150.

Figure 2A:
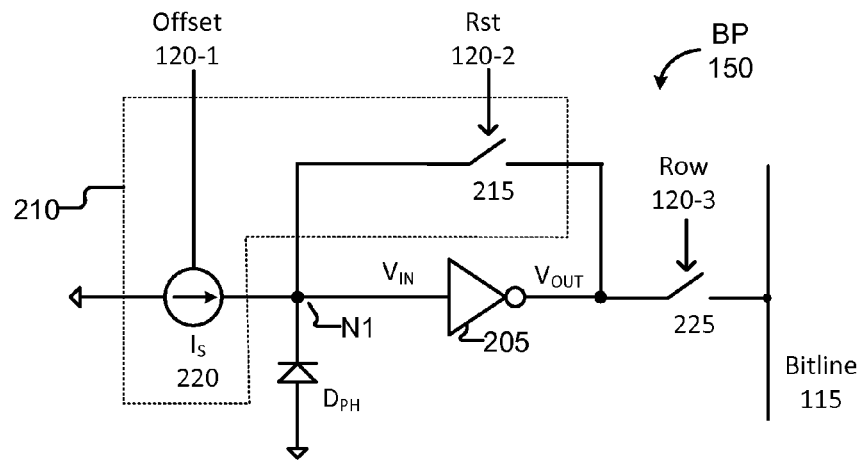
FIG. 2A is a binary pixel circuit of the binary pixel image sensor, according to an embodiment.

FIG. 2A is a binary pixel circuit 150 of the binary pixel image sensor 110, according to an embodiment. The BP 150 includes a binary amplifier 205, initialization circuitry 210 (which includes reset circuitry and offset circuitry), and a light detecting element in the form of a photodiode $D_{PH}$ that are all directly coupled to a common node N1 of the BP 150. The BP 150 can also include a pixel selection switch 225 directly coupled to the output of the binary amplifier 205 and a bitline 115. The bitline may be shared in a way that requires BP 150 to be isolated at some portions of the overall image exposure time. As used herein, the term "directly coupled" is used to indicate that two elements are in direct physical or electrical contact without any intervening elements. The term "coupled," however, may mean that two elements are either directly coupled, or that the two elements interact through intervening circuit elements. Any embodiment elements described herein as being directly coupled to each other generally may also be coupled to each other, and vice versa.

The input of the binary amplifier 205 is directly coupled to the node N1 and receives the voltage at the node N1 as an input voltage $V_{IN}$. The binary amplifier 205 produces a binary output signal $V_{OUT}$ according to whether the input voltage $V_{IN}$ to the binary amplifier 205 is higher or lower than a switching threshold voltage level of the binary amplifier 205. The switching threshold voltage level defines the input voltage level at which the binary output signal $V_{OUT}$ switches binary states. For example, if the input voltage $V_{IN}$ is lower than the switching threshold voltage level, the binary amplifier 205 produces a binary output signal $V_{OUT}$ that represents a logical 1. If the input voltage $V_{IN}$ is higher than the switching threshold voltage level, the binary amplifier 205 produce a binary output signal $V_{OUT}$ that represents a logical 0. In one embodiment, the binary amplifier 205 is a high gain inverter that applies a high level of gain to the input voltage $V_{IN}$ when generating the binary output signal $V_{OUT}$.

The initialization circuitry 210 initializes the input voltage $V_{IN}$ at the node N1 by resetting the input voltage $V_{IN}$ at node N1 to a switching threshold of the binary amplifier 205, and then offsetting the input voltage $V_{IN}$ at node N1 from the switching threshold. The result is that the input voltage $V_{IN}$ is set to a voltage level that is offset from the switching threshold voltage level of the binary amplifier 205. The amount of the offset may correspond to the minimum amount of light detectable by the binary pixel BP 150. As shown, the initialization circuitry 210 includes reset circuitry in the form of a reset switch 215 and offset circuitry in the form of a current source (Is) 220. Reset switch 215 can be, for example, a NMOS or PMOS type transistor.

The reset switch 215 is directly coupled between the input and output of the binary amplifier 205 and is controlled by a reset control signal (Rst) 120-2 generated by the pixel control circuit 125. Closing the reset switch 215 causes the input voltage $V_{IN}$ to the binary amplifier 205 to be set to substantially the same voltage level as the switching threshold voltage level of the binary amplifier 205. This behavior is due to the feedback path created by the reset switch 215 that equalizes the voltage levels of the input voltage $V_{IN}$ and output signal $V_{OUT}$. In other words, the reset switch 215 acts as a self-bias circuit that biases the binary amplifier 205 to its maximum gain. When the reset switch 215 is then open, the input voltage $V_{IN}$ is no longer tied to the binary output signal $V_{OUT}$ and may start changing in voltage level.

In one embodiment, each row of BPs 150 (where a row is a group of BPs affected by a row-wise reset signal, and may comprise, e.g., one BP in each SP in a row) is coupled to its own reset control signal 120-2. This enables an entire row of BPs 150 in an array to be reset simultaneously after the row of BPs 150 is read by respective pixel control circuits 125. In another embodiment, each BP 150 is coupled to its own separate reset control signal 120-2. This enables conditional reset of a single BP 150 at a time. Embodiments can also multiplex both a row-wise and a BP-specific reset onto reset control signal 120-2.

The current source 220 is directly coupled to the input of the binary amplifier 205 and is controlled by an offset control signal (Offset) 120-2 generated by the pixel control circuit 125. The current source 220 adjusts the voltage level of the input voltage $V_{IN}$ by injecting electrical charge into (or removing electrical charge from) node N1. The amount of the voltage change offsets the input voltage $V_{IN}$ of the binary amplifier 205 relative to the switching threshold of the binary amplifier 205, causing the binary amplifier output $V_{OUT}$ to switch from the self-bias midpoint to a logical "low" condition (or logical "high" when removing charge from node N1).

The cathode terminal of the photodiode $D_{PH}$ is directly coupled to the input of the binary amplifier 205 and the anode terminal of the photodiode $D_{PH}$ is directly coupled to ground. The photodiode $D_{PH}$ is operated in reverse-bias such that the cathode voltage is higher than the anode voltage. When exposed to light, photons strike the photodiode $D_{PH}$ and cause the photodiode $D_{PH}$ to collect photoelectrons. As a result, the input voltage $V_{IN}$ to the binary amplifier 205 is lowered according to the amount of light incident on the photodiode $D_{PH}$.

The pixel selection switch 225 is directly coupled to the output of the binary amplifier 205 and the bitline 115. The pixel selection switch 225 is controlled by a row selection signal (Row) 120-3 generated by the pixel control circuit 125. The row selection signal 120-3 may be coupled to an entire row of BPs 150 so that the entire row of BPs can be selected at the same time. When the row selection signal 120-3 is asserted, the pixel selection switch 225 is closed and the digital output signal $V_{OUT}$ is read onto the bitline 115, where it can be sampled by the pixel control circuit 125. Row selection switch 225 can be, for example, a NMOS or PMOS type transistor.

Figure 2B:
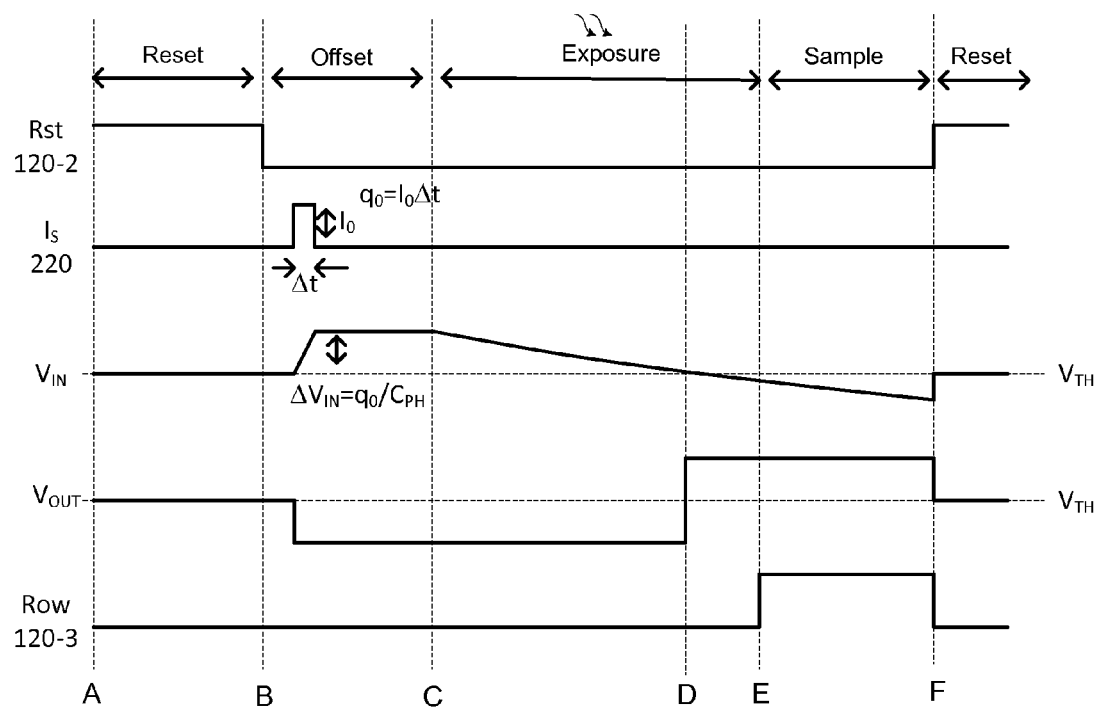
FIG. 2B is a timing diagram illustrating the operation of the binary pixel circuit of FIG. 2A, according to an embodiment.

FIG. 2B is a timing diagram illustrating the operation of the binary pixel circuit 150 of FIG. 2A, according to an embodiment. The timing diagram of FIG. 2B assumes that switch 215 and switch 225 are both NMOS transistors. During a reset phase between times A and B, the reset control signal 120-2 is asserted to close the reset switch 215. Closing the reset switch 215 has the effect of setting the input voltage $V_{IN}$ and binary output signal $V_{OUT}$ to the switching threshold voltage level $V_{TH}$ of the binary amplifier 205.

During an offset setting phase between times B and C, the current source 220 is turned on and injects charge into node N1. The total amount of charge injected into node N1 is represented by the following equation:

$$q_0 = I_0 \Delta t \tag{1}$$

where $q_0$ is the total amount of charge injected into node N1, $I_0$ is the current level of the current source 220, and $\Delta t$ is the on-time of the current source 220. In a given embodiment, "charge injection" physically depletes electrons from the photodiode, with "charge injection" in this context indicating the addition of positive charge carriers and/or the removal of negative charge carriers.

The injected charge $q_0$ increases the level of the input voltage according to the following equation:

$$\Delta V_{IN} = q_0 / C_{PH} \quad (2)$$

where $\Delta V_{IN}$ is the total amount of voltage change in the input voltage $V_{IN}$ and $C_{PH}$ is the capacitance of the photodiode $D_{PH}$ plus any other capacitance seen at node N1. By controlling the on-time of the current source 220 and/or $I_0$, the pixel control circuit 125 thus controls the offset voltage amount (i.e. $\Delta V_{IN}$) that is added to the input voltage relative to the switching threshold voltage level $V_{TH}$.

At time C, the input voltage $V_{IN}$ now has an offset relative to the switching threshold voltage level $V_{TH}$ due to the charge that was injected into node N1. During an exposure phase between time C and E, the photodiode $D_{PH}$ is exposed to light and collects photoelectrons, thereby causing the level of the input voltage $V_{IN}$ to decrease. At time D, the level of the input voltage $V_{IN}$ crosses the switching threshold voltage level $V_{TH}$ and causes the binary output signal $V_{OUT}$ to switch binary states. As shown in FIG. 2B, the offset voltage amount introduced onto input voltage $V_{IN}$ by current source 220 between times B and C is substantially identical to the voltage decrease caused by the photodiode $D_{PH}$ between times C and D. The voltage offset thus represents a threshold amount of light that is to be detected by the photodiode $D_{PH}$ before the binary output signal $V_{OUT}$ switches states, and is precisely set to a desired level under the control of the pixel control circuit 125. In a given embodiment, exposure can begin at time B, with charge injection occurring during a portion of the exposure interval.

During a sampling phase between time E and F, the pixel control circuit samples the binary output signal $V_{OUT}$ by asserting the row selection signal 120-3. The binary output signal $V_{OUT}$ is output onto the bitline 115 and sampled by the control logic 125. At time F, the pixel control circuit 125 asserts the reset control signal 120-2 to reset and re-initialize the BP 150.

Beneficially, both the structure and operation of the BP 150 can increase the noise immunity of the binary pixel image sensor 150. By directly coupling the photodiode $D_{PH}$ to the input of the binary amplifier 205, the analog to digital conversion of the input voltage $V_{IN}$ can be done in one stage to reduce noise caused by intervening components along the readout path. Additionally, resetting the input voltage $V_{IN}$ to the switching threshold voltage level $V_{TH}$ reduces fixed pattern noise that would otherwise be caused by differences in threshold voltages $V_{TH}$ across the binary pixel image sensor 100.

It should be noted that FIG. 2B is not drawn precisely to scale and some periods of time have been exaggerated for ease of explanation. For example, the length of time between time B and time C may be much shorter than that shown in FIG. 2B. The input voltage $V_{IN}$ may also decrease slightly between time B and time C due to exposure of the photodiode $D_{PH}$ to light during this period of time.

Figure 2C:
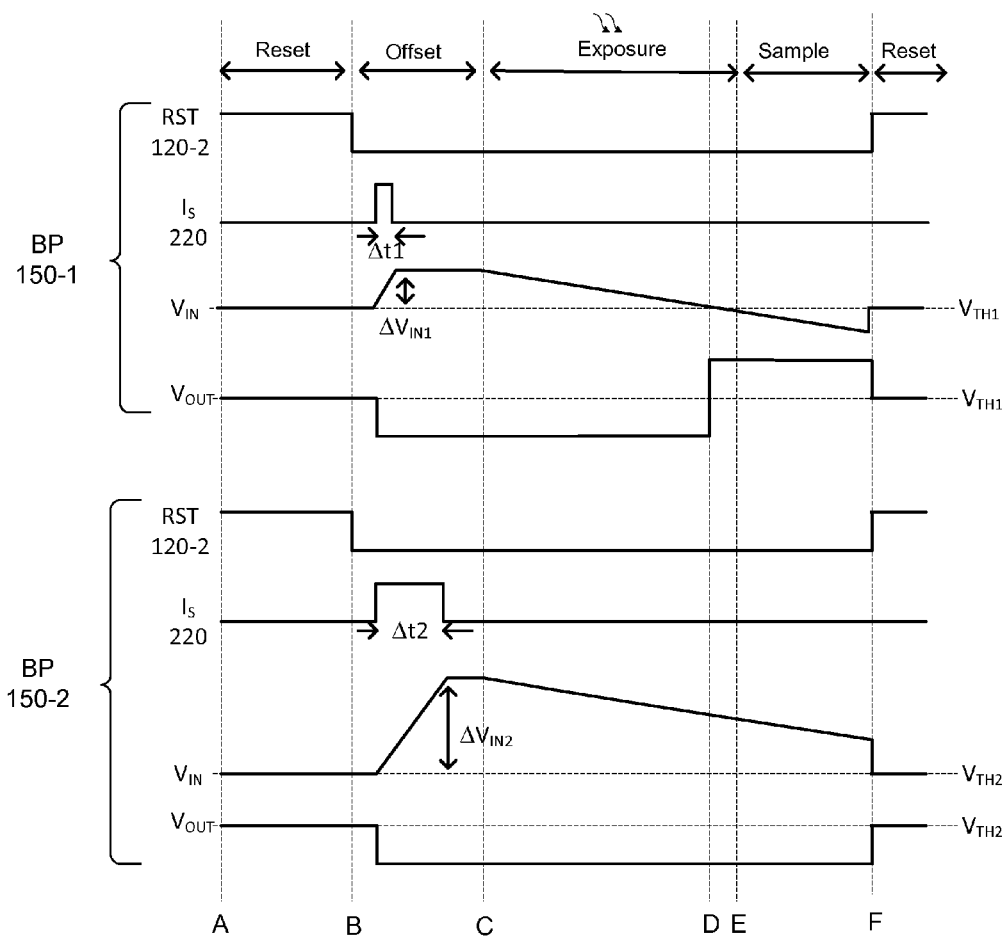
FIG. 2C is a timing diagram illustrating the operation of multiple binary pixel circuits of FIG. 2A that have different voltage offsets, according to an embodiment.

In one embodiment, the pixel control circuit 125 may introduce the same voltage offset to the input voltages $V_{IN}$ of all the BPs 150. Alternatively, the pixel control circuit 125 may introduce different voltage offsets to the input voltages $V_{IN}$ of different BPs 150. FIG. 2C is a timing diagram illustrating the operation of multiple binary pixel circuits of FIG. 2A that have different voltage offsets, according to an embodiment. FIG. 2C shows timing information for two BPs 150-1 and 150-2. The timing information for BP 150-1 and BP 150-2 is substantially the same as that shown in FIG. 2B. However, the on-time $\Delta t1$ of current source 220 for BP 150-1 is shorter than the on-time $\Delta t2$ of current source 220 for BP 150-2. As a result, the input voltage offset $\Delta V_{IN1}$ for BP 150-1 is smaller than the input voltage offset $\Delta V_{IN2}$ for BP 150-2.

Because voltage offset $\Delta V_{IN2}$ is greater than voltage offset $\Delta V_{IN1}$, BP 150-2 must be exposed to a larger amount of light than BP 150-1 before the output signal $V_{OUT}$ of BP 150-2 switches states. For example, assuming that BP 150-1 and BP 150-2 are exposed to identical amounts of light, the output signal $V_{OUT}$ of BP 150-1 switches binary states at time D, whereas the output signal $V_{OUT}$ of BP 150-2 does not switch binary states at time D. FIG. 2C also shows that BP 150-2 is unconditionally reset at time F, regardless of whether its input signal $V_{IN}$ has crossed the switching threshold $V_{TH2}$.

Additionally, the threshold voltage $V_{TH1}$ for BP 150-1 may be different than the threshold voltage $V_{TH2}$ for BP 150-2. The difference in threshold voltages does not affect the operation of the BPs 150 since the binary amplifier 205 in each BP 150 amp resets to its own threshold voltage. For example, if the input voltage change $\Delta V_{IN2}$ for BP 150-2 was the same as the input voltage change $\Delta V_{IN1}$ for BP 150-1, the output voltages $V_{OUT}$ for both BP 150-1 and 150-2 would change binary values at time C.

Figure 3A:
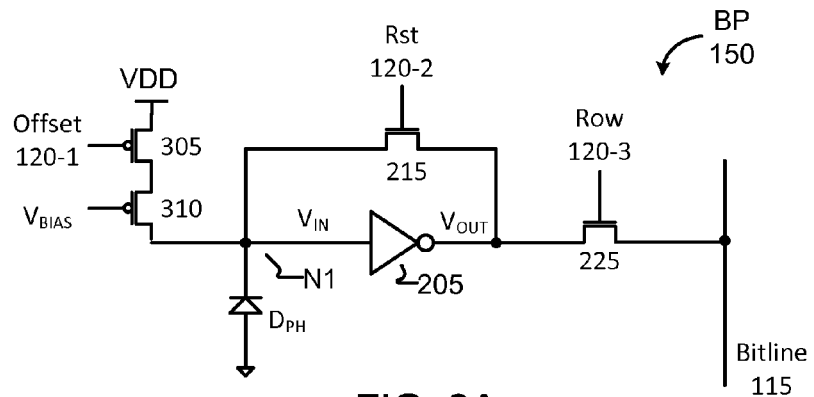
FIG. 3A is a binary pixel circuit of the binary pixel image sensor, according to another embodiment.

FIG. 3A is a binary pixel circuit 150 of the binary pixel image sensor 100, according to another embodiment. The BP 150 of FIG. 3A is similar to the BP 150 of FIG. 2A, but now includes two PMOS transistors 305 and 310 that form the offset circuitry and switches 215 and 225 are shown as NMOS transistors. Transistors 305 and 310 together form a charge injection circuit that injects charge into node N1. The source of transistor 305 is coupled to a VDD voltage source and the gate of transistor 305 is coupled to the offset control signal 120-1. When the offset control signal 120-1 is asserted, current flows from VDD onto node N1 through transistors 305 and 310 and adds electrical charge to node N1. The gate of transistor 310 is coupled to a bias voltage $V_{BIAS}$ and the level of the bias voltage $V_{BIAS}$ sets the amount of current that can flow through the transistor 310. In one embodiment, each of the BPs 150 may be coupled to a common bias voltage $V_{BIAS}$. Alternatively, different BPs 150 may be coupled to different bias voltages $V_{BIAS}$ having different voltage levels.

Figure 3B:
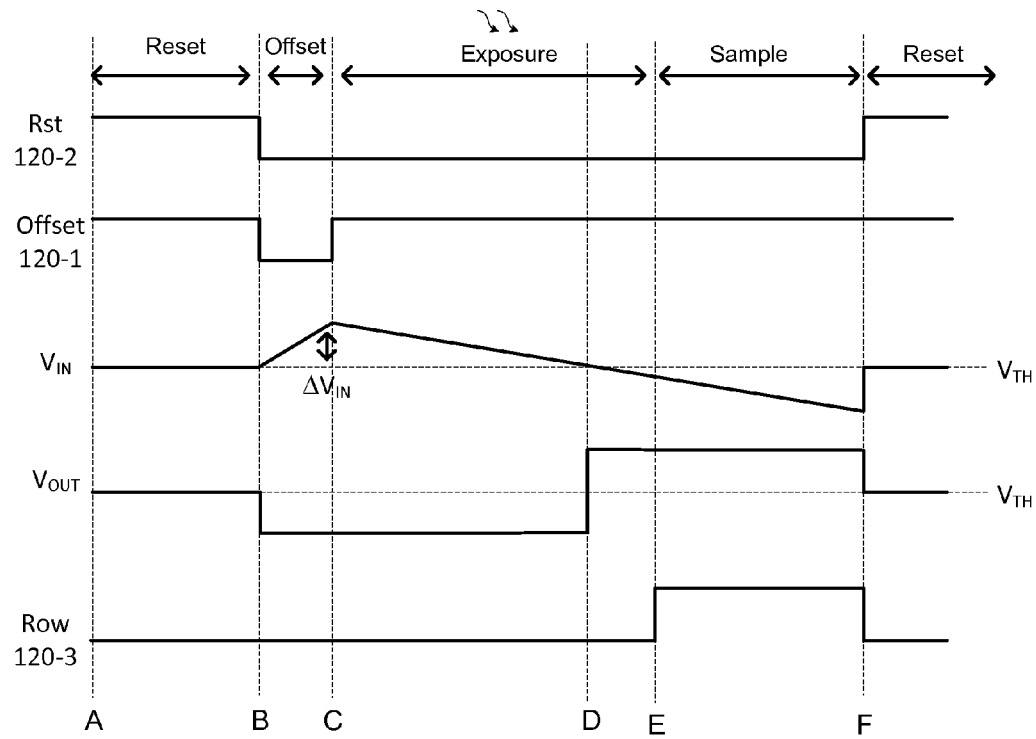
FIG. 3B is a timing diagram illustrating the operation of the binary pixel circuit of FIG. 3A, according to an embodiment.

FIG. 3B is a timing diagram illustrating the operation of the binary pixel circuit 150 of FIG. 3A, according to an embodiment. The timing diagram of FIG. 3B is similar to the timing diagram of FIG. 2B, but now includes timing information for the offset control signal 120-1. Initially between times A and B, the reset control signal 120-2 is asserted to close the reset switch 215, which sets the input voltage $V_{IN}$ and output signal $V_{OUT}$ to the switching threshold voltage level $V_{TH}$ of the binary amplifier 205. Between times B and C, the offset control signal 120-1 is asserted to inject charge into node N1 and to offset the level of the input voltage $V_{IN}$ relative to the switching threshold voltage level $V_{TH}$. The amount of the voltage offset is proportional to the on-time of transistor 305, as controlled by the offset control signal 120-1.

Figure 4A:
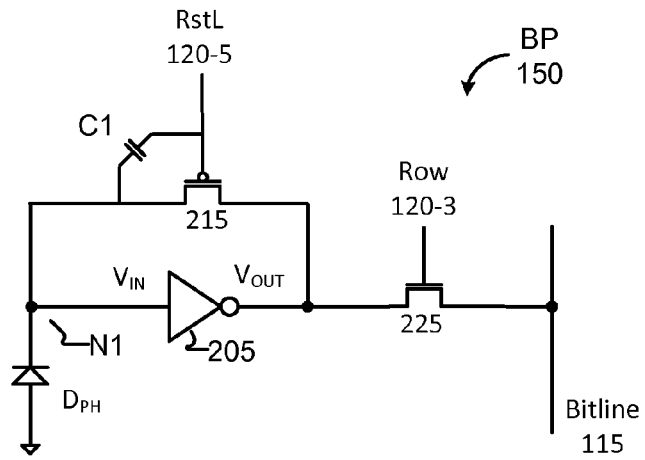
FIG. 4A is a binary pixel circuit of the binary pixel image sensor, according to another embodiment.

FIG. 4A is a binary pixel circuit 150 of the binary pixel image sensor 100, according to another embodiment. The BP 150 of FIG. 4A is similar to the BP 150 of FIG. 2A, but reset switch 215 is now a PMOS transistor and is controlled by an active low reset signal (RstL) 120-5. Additionally, a capacitor C1 is shown as being coupled between the gate of the reset switch 215 and the node N1 at the input to the binary amplifier 205. The capacitor C1 may be any capacitive element, such as the parasitic capacitance of the switch 215. Alternatively, the capacitor C1 may be a separate component coupled between node N1 and the gate of the switch 215.

Figure 4B:
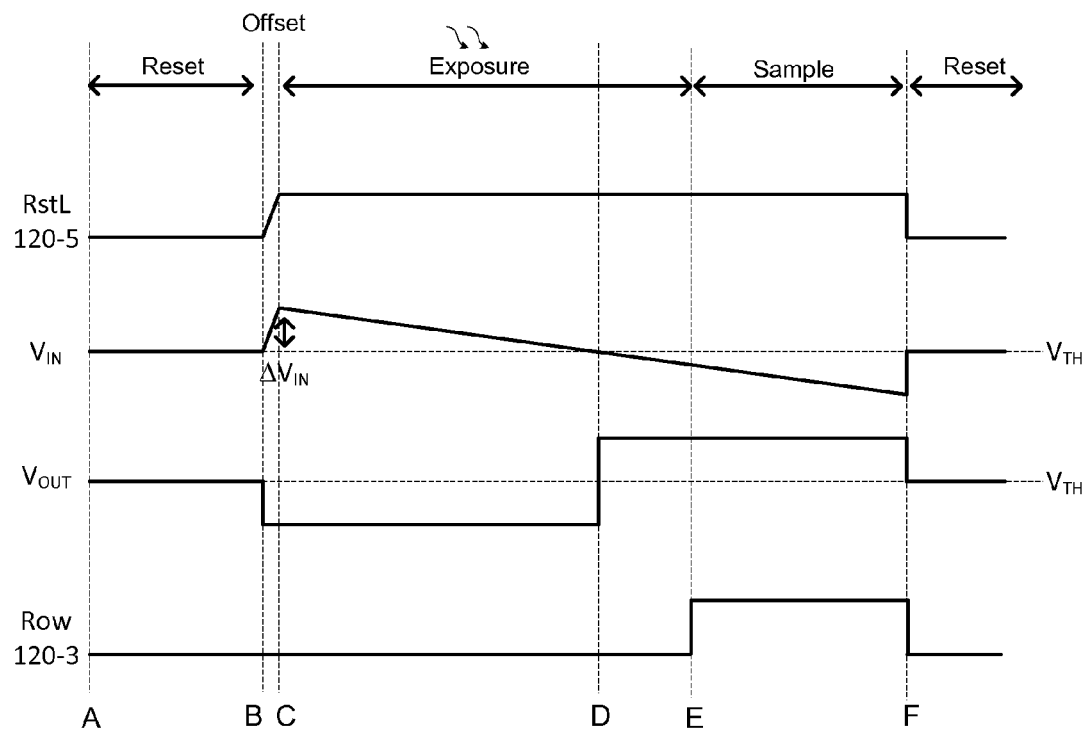
FIG. 4B is a timing diagram illustrating the operation of the binary pixel circuit of FIG. 4A, according to an embodiment.

The capacitor C1 functions as an offset circuit that offsets the input voltage $V_{IN}$ to the binary amplifier 205 using capacitive coupling. Referring to FIG. 4B, shown is a timing diagram illustrating the operation of the binary pixel circuit 150 of FIG. 4A, according to an embodiment. The timing diagram of FIG. 4B is similar to the timing diagram of FIG. 2B, but now includes timing information for the active low reset control signal 120-5. Between times A and B, the reset control signal 120-5 is asserted to close the reset switch 215, which sets the input voltage $V_{IN}$ and binary output signal $V_{OUT}$ to the switching threshold voltage level $V_{TH}$ of the binary amplifier 205. During the offset setting phase between times B and C, the reset control signal 120-5 is de-asserted and rises to a high voltage level. The voltage change of the reset control signal 120-5 is capacitively coupled to node N1 through capacitor C1, thereby offsetting the level of the input voltage $V_{IN}$ relative to the switching threshold voltage level $V_{TH}$. The duration of the offset setting phase may be as short as the rise time of the reset control signal 120-5.

In addition, the input voltage change $\Delta V_{IN}$ at node N1 between times B and C may also be caused by the channel of the PMOS reset switch 215. When the RstL 120-5 is asserted between times A and B and the PMOS reset switch 215 is on, a channel of positive charges forms under the gate of the PMOS reset switch 215. When RstL 120-5 is de-asserted at time B, these positive charges ("holes") escape to the source and drain of the PMOS reset switch 215. Roughly half of the charges that were forming the channel end up at node N1, raising the input voltage $V_{IN}$ level. The amount of the voltage change $\Delta V_{IN}$ depends on the number of holes injected into N1, which is affected by factors such as the number of holes that were forming the channel, the size of the PMOS reset switch 215, as well as the high and low levels of RstL 120-5

Figure 5A:
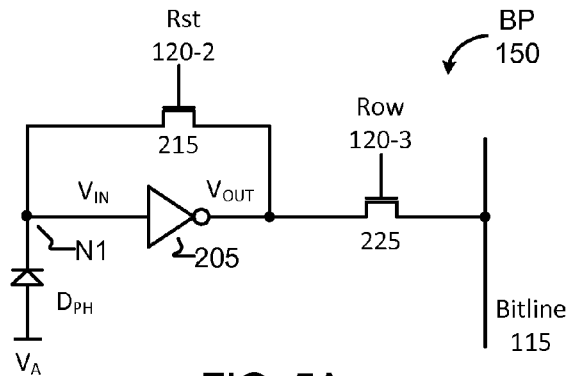
FIG. 5A is a binary pixel circuit of the binary pixel image sensor, according to another embodiment.

FIG. 5A is a binary pixel circuit 150 of the binary pixel image sensor 100, according to another embodiment. The BP 150 of FIG. 5A is similar to the BP 150 of FIG. 2A, but now the anode terminal of the photodiode $D_{PH}$ is coupled to an adjustable voltage node that includes an adjustable voltage $V_A$. The level of adjustable voltage $V_A$ may be controlled directly or indirectly by one of the control signals 120 of the pixel control circuit 125.

Figure 5B:
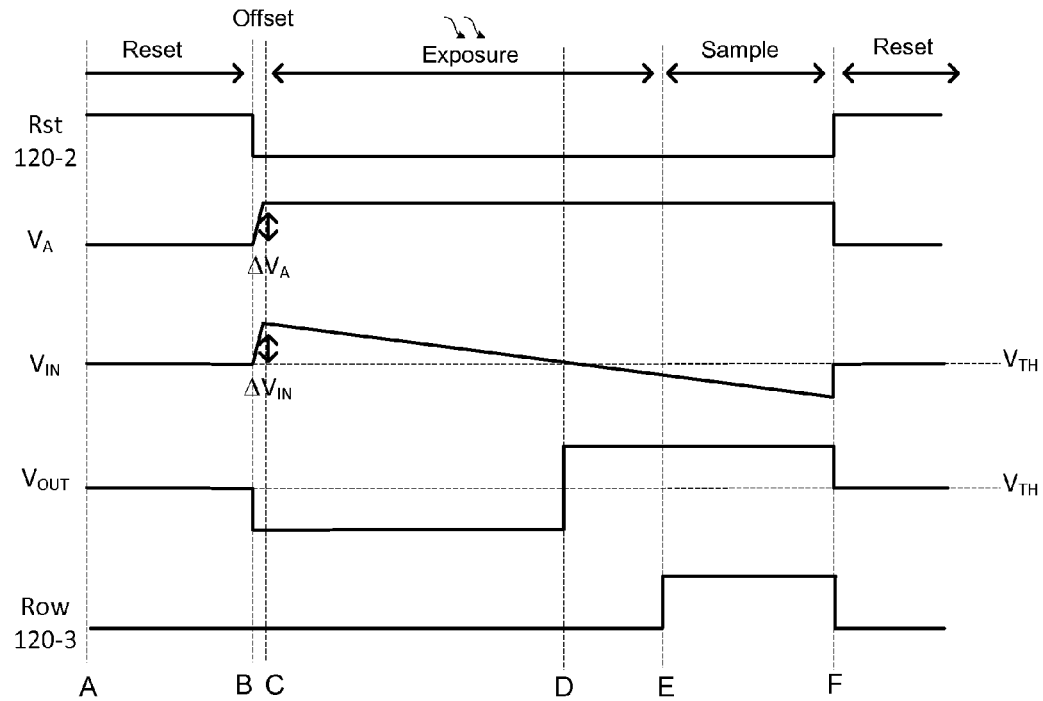
FIG. 5B is a timing diagram illustrating the operation of the binary pixel circuit of FIG. 5A, according to an embodiment.

The photodiode $D_{PH}$ and the adjustable voltage node together function as the offset circuitry. Referring to FIG. 5B, shown is a timing diagram illustrating the operation of the binary pixel circuit 150 of FIG. 5A. FIG. 5B is similar to FIG. 2B, but now includes the timing for the adjustable voltage $V_A$ 120-5 at the adjustable voltage node. Between times A and B, the reset control signal 120-2 is asserted to close the reset switch 215, which sets the input voltage $V_{IN}$ and binary output signal $V_{OUT}$ to the switching threshold voltage level $V_{TH}$ of the binary pixel amplifier 205. The adjustable voltage $V_A$ is set to zero volts.

Figure 6A:
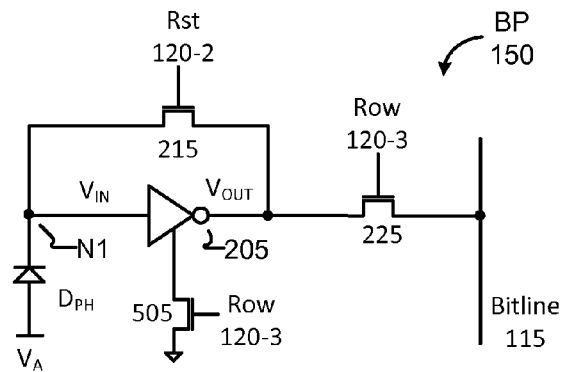
FIG. 6A is a binary pixel circuit of the binary pixel image sensor, according to another embodiment.

During the offset-setting phase between times B and C, node N1 is floating because the reset switch 120-2 is now open. The level of the adjustable voltage $V_A$ is increased and rises to a higher voltage level. The photodiode acts as a capacitor that is coupled between the adjustable voltage $V_A$ and node N1. The voltage change $\Delta V_A$ of the adjustable voltage $V_A$ is thus coupled to node N1 through the photodiode $D_{PH}$, thereby offsetting the level of the input voltage $V_{IN}$ relative to the switching threshold voltage level $V_{TH}$. The adjustable voltage change $\Delta V_A$ is substantially equal to the input voltage change $\Delta V_{IN}$ FIG. 6A is a binary pixel circuit 150 of the binary pixel image sensor 100, according to an embodiment. FIG. 6A is similar to FIG. 5A, but now includes an enable transistor 505 to enable or disable the binary amplifier 205 based on the row selection signal 120-3. Adding the ability to enable the binary amplifier 205 is a refinement that allows the binary amplifier 205 to be disabled to save power when no evaluation of the N1 voltage is needed. When the binary amplifier 205 is disabled, it forces the binary output signal $V_{OUT}$ to a VDD voltage level. The enable transistor 505 may also be used in conjunction with any of the BP 150 embodiments shown herein.

Figure 6B:
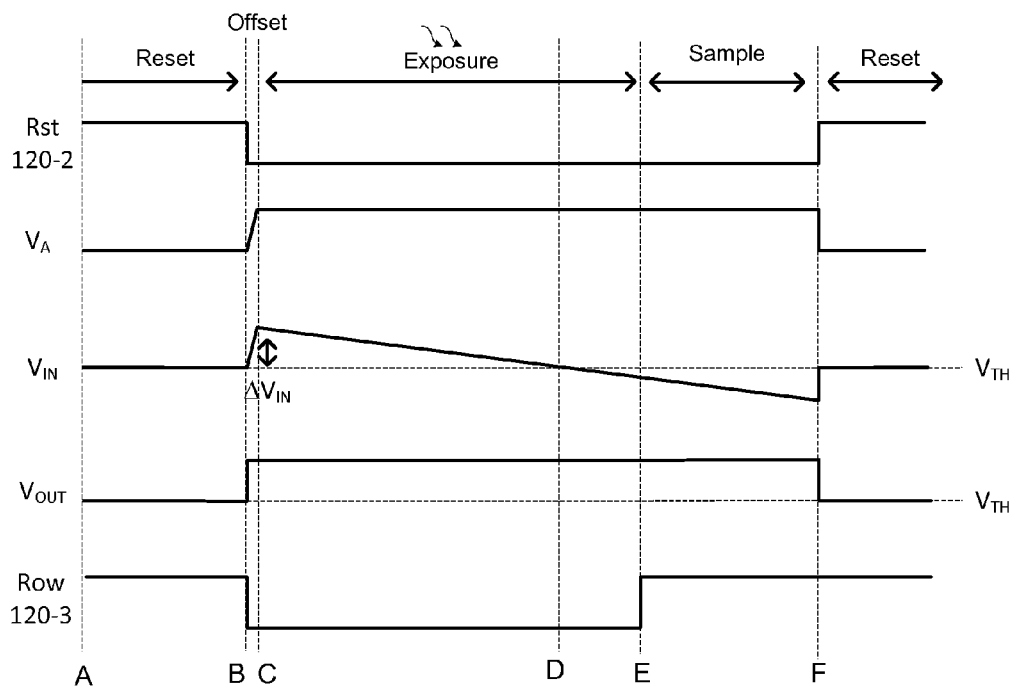
FIG. 6B is a timing diagram illustrating the operation of the binary pixel circuit of FIG. 6A, according to an embodiment.

FIG. 6B is a timing diagram illustrating the operation of the binary pixel circuit 150 of FIG. 6A, according to an embodiment. The timing diagram of FIG. 6B is similar to the timing diagram of FIG. 5B, but now the row select signal 120-3 is asserted during the reset phase between time A to B and after time F. The binary output signal $V_{OUT}$ is also pulled to a VDD voltage level between time C and E because the binary amplifier 205 is disabled during this period of time. At time D, when the input voltage $V_{IN}$ crosses the threshold, it does not cause any change in the output signal $V_{OUT}$ because the binary amplifier 205 is still disabled. At time E, when the binary amplifier 205 is enabled, the output signal $V_{OUT}$ remains high because the input voltage $V_{IN}$ is below the switching threshold voltage $V_{TH}$. On the other hand, if the input voltage $V_{IN}$ was above the switching threshold voltage $V_{TH}$ at time E, the output signal $V_{OUT}$ would become logic low.

Figure 7A:
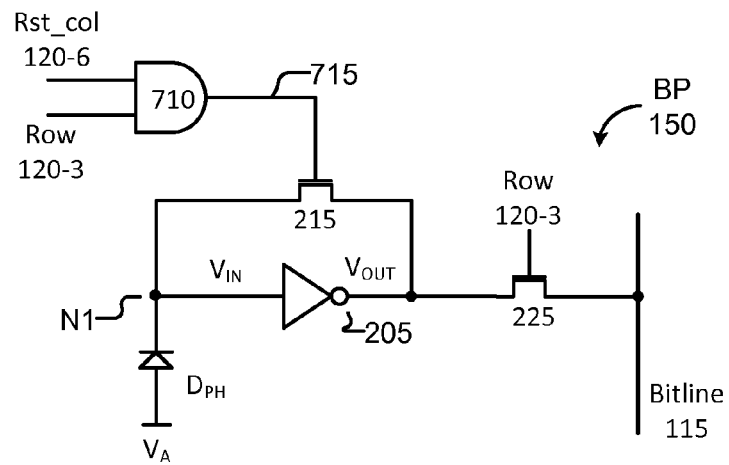
FIG. 7A is a binary pixel circuit of the binary pixel image sensor, according to another embodiment.

FIG. 7A is a binary pixel circuit 150 of the binary pixel image sensor 100, according to another embodiment. The BP 150 of FIG. 7A is similar to the BP 150 of FIG. 5A, but now includes an AND gate 710 that combines the row selection signal 120-3 with a column reset signal (Rst_col) 120-6. The output 715 of the AND gate 710 closes and opens the reset switch 215. By conditioning the control of the reset switch 215 on both the row selection signal 120-3 and a column reset signal 120-6, the pixel control circuit 125 can reset each BP 150 independently of the other BPs 150 accessed by the same row signal. The AND gate 710 may also be used in conjunction with any of the BP 150 embodiments shown herein. If used in conjunction with the embodiment of FIG. 4A, the AND gate 710 would instead be a NAND gate.

Figure 7B:
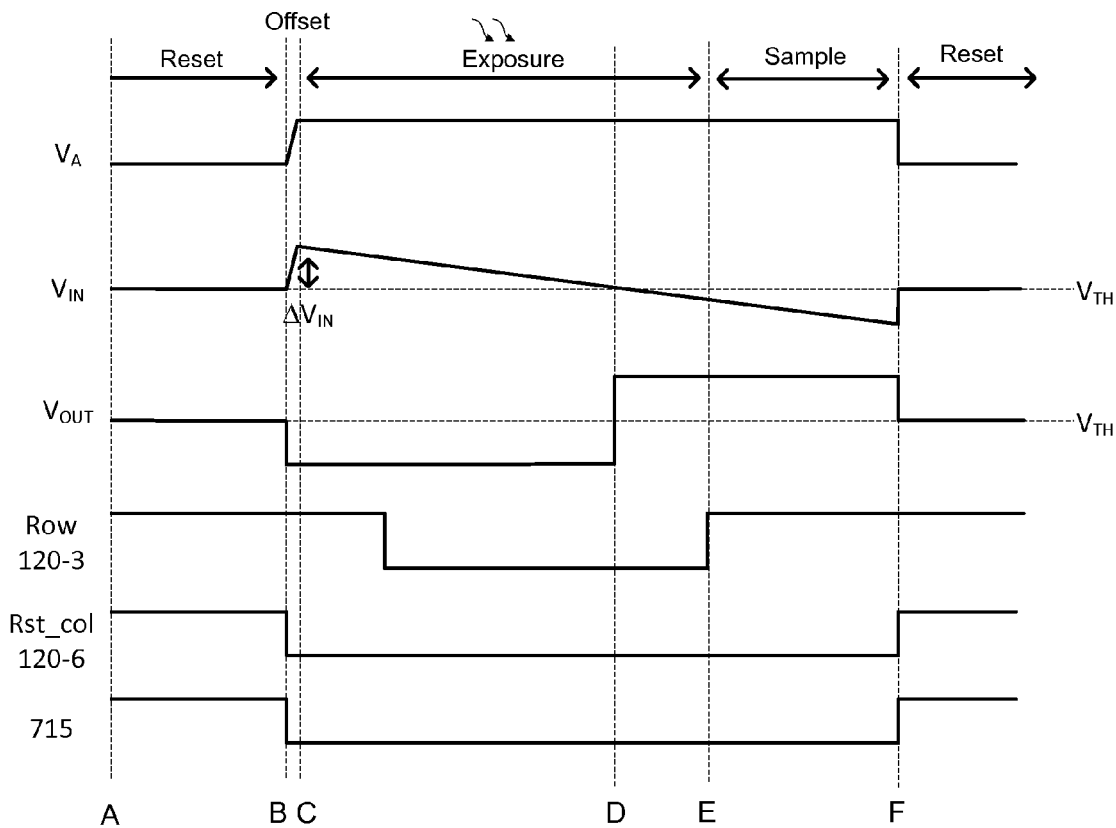
FIG. 7B is a timing diagram illustrating the operation of the binary pixel circuit of FIG. 7A, according to an embodiment.

FIG. 7B is a timing diagram illustrating the operation of the binary pixel circuit 150 of FIG. 7A, according to an embodiment. The timing diagram of FIG. 7B is similar to the timing diagram of FIG. 6B, but now includes timing information for the column reset signal 120-6 and the AND gate output 715. Between time A and B, and also after time F, both the row select signal 120-3 and column reset signal 120-6 are asserted, which causes the AND gate output 715 to close the reset switch 225. During all other periods of time, the AND gate output 715 opens the reset switch 225.

Upon reading this disclosure, those of skill in the art may appreciate still additional alternative designs for a binary pixel image sensor that includes binary pixel circuits. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:
1. A binary pixel circuit comprising:
a light-detecting element;
a binary amplifier having an input and an output, the input of the binary amplifier coupled to the light-detecting element, the binary amplifier generating a binary signal at the output in response to whether an input voltage at the input exceeds a switching threshold voltage level of the binary amplifier;

a pixel selection switch coupling an output of the binary amplifier to a bitline; and initialization circuitry coupled to the input of the binary amplifier, the initialization circuitry setting the input voltage to a level that is offset relative to the switching threshold voltage level of the binary amplifier by an offset voltage amount, the offset voltage amount corresponding to a threshold amount of light incident on the light-detecting element.

2. The binary pixel circuit of claim 1, wherein the input of the binary amplifier is directly coupled to the light-detecting element without intervening elements between the input of the binary amplifier and the light-detecting element.

3. The binary pixel circuit of claim 1, further comprising: an amplifier enable circuit to enable and disable the binary amplifier responsive to a row selection signal.

4. The binary pixel circuit of claim 1, wherein the binary amplifier is an inverting binary amplifier.

5. The binary pixel circuit of claim 1, wherein the light detecting element is a photodiode, a terminal of the photodiode coupled to the input of the binary amplifier.

6. The binary pixel circuit of claim 1, wherein a state of the pixel selection switch is controlled by a row selection signal.

7. A binary pixel circuit comprising:

a light-detecting element;

a binary amplifier having an input and an output, the input of the binary amplifier coupled to the light-detecting element, the binary amplifier generating a binary signal at the output in response to whether an input voltage at the input exceeds a switching threshold voltage level of the binary amplifier; and initialization circuitry coupled to the input of the binary amplifier, the initialization circuitry setting the input voltage to a level that is offset relative to the switching threshold voltage level of the binary amplifier by an offset voltage amount, the offset voltage amount corresponding to a threshold amount of light incident on the light-detecting element, the initialization circuitry comprising:

reset circuitry coupled to the input of the binary amplifier, the reset circuitry resetting the input voltage to the switching threshold voltage level; and offset circuitry coupled to the input of the binary amplifier, the offset circuitry adjusting the input voltage by the offset voltage amount after the reset circuitry resets the input voltage to the switching threshold voltage level.

8. The binary pixel circuit of claim 7, wherein the offset circuitry is a current source that injects electric charge onto the input of the binary amplifier to adjust the input voltage by the offset voltage amount.

9. The binary pixel circuit of claim 8, wherein the current source comprises a transistor coupling a voltage source to the input of the binary amplifier, the transistor allowing charge to flow from the voltage source to the input of the binary amplifier to adjust the input voltage from the switching threshold voltage level by the offset voltage amount.

10. The binary pixel circuit of claim 7, wherein the reset circuitry comprises:

a transistor coupled to the input of the binary amplifier and the output of the binary amplifier.

11. The binary pixel circuit of claim 10, wherein the offset circuitry comprises:

a capacitive element coupled between a gate of the transistor of the reset circuitry and the input of the binary amplifier, the capacitive element coupling a voltage change from the gate of the transistor to the input of the binary amplifier to adjust the input voltage by the offset voltage amount.

12. The binary pixel circuit of claim 10, wherein the offset circuitry comprises:

a gate channel of the transistor of the reset circuitry, the gate channel forming charges that are injected into the input of the binary amplifier to adjust the input voltage by the offset voltage amount.

13. The binary pixel circuit of claim 7, wherein a first terminal of the light detecting element is coupled to the input of the binary amplifier and a second terminal of the light detecting element is coupled to an adjustable voltage node, and the offset circuitry comprises the light detecting element, the light detecting element coupling a voltage change from the adjustable voltage node to the input of the binary amplifier to adjust the input voltage by the offset voltage amount.

14. A binary pixel circuit comprising:

a light-detecting element;

a binary amplifier having an input and an output, the input of the binary amplifier coupled to the light-detecting element, the binary amplifier generating a binary signal at the output in response to whether an input voltage at the input exceeds a switching threshold voltage level of the binary amplifier; and initialization circuitry coupled to the input of the binary amplifier, the initialization circuitry setting the input voltage to a level that is offset relative to the switching threshold voltage level of the binary amplifier by an offset voltage amount, the offset voltage amount corresponding to a threshold amount of light incident on the light-detecting element; and circuitry coupled to the initialization circuitry that causes the initialization circuitry to set the input voltage to the switching threshold voltage level only when both a first control signal indicates that the binary pixel circuit is selected and a second control signal indicates that the binary pixel circuit is to be reset.

15. A method of operation in a binary pixel circuit having a light-detecting element coupled to an input of a binary amplifier, comprising:

setting an input voltage at the input to the binary amplifier to a level that is offset relative to a switching threshold voltage level of the binary amplifier by an offset voltage amount, the offset voltage amount corresponding to a threshold amount of light incident on the light-detecting element, wherein setting the input voltage to the level that is offset relative to the switching threshold voltage level comprises:

resetting, with reset circuitry coupled to an input of the binary amplifier, the input voltage to the switching threshold voltage level; and adjusting, with offset circuitry coupled to an input of the binary amplifier, the input voltage by the offset voltage amount after resetting the input voltage to the switching threshold voltage level;

detecting light at the light-detecting element;

changing the input voltage according to the amount of detected light; and generating a binary signal at the output of the binary amplifier, the binary signal generated responsive to whether the input voltage exceeds the switching threshold voltage level of the binary amplifier.

16. An integrated-circuit image sensor comprising:
an array of pixel regions, each pixel region comprising a plurality of binary pixel circuits, each binary pixel circuit comprising:
   a light-detecting element;
   a binary amplifier having an input and an output, the input of the binary amplifier coupled to the light-detecting element, the binary amplifier generating a binary signal at the output in response to whether an input voltage at the input exceeds a switching threshold voltage level of the binary amplifier;
   a pixel selection switch coupling an output of the binary amplifier to a bitline; and
   initialization circuitry coupled to the input of the binary amplifier, the initialization circuitry setting the input voltage to a level that is offset relative to the switching threshold voltage level of the binary amplifier by an offset voltage amount, the offset voltage amount corresponding to a threshold amount of light incident on the light-detecting element.

17. The integrated-circuit image sensor of claim 16, wherein the input of the binary amplifier is directly coupled to the light-detecting element without intervening elements between the input of the binary amplifier and the light-detecting element.

18. The integrated-circuit image sensor of claim 16, further comprising control circuitry to, for first and second binary pixel circuits in one of the pixel regions, cause respective first and second binary pixel circuit initialization circuitry to set their respective input voltages with different offset voltage amounts.

19. An integrated-circuit image sensor comprising:
an array of pixel regions, each pixel region comprising a plurality of binary pixel circuits, each binary pixel circuit comprising:
   a light-detecting element;
   a binary amplifier having an input and an output, the input of the binary amplifier coupled to the light-detecting element, the binary amplifier generating a binary signal at the output in response to whether an input voltage at the input exceeds a switching threshold voltage level of the binary amplifier; and
   initialization circuitry coupled to the input of the binary amplifier, the initialization circuitry setting the input voltage to a level that is offset relative to the switching threshold voltage level of the binary amplifier by an offset voltage amount, the offset voltage amount corresponding to a threshold amount of light incident on the light-detecting element, the initialization circuitry comprising:
      reset circuitry coupled to the input of the binary amplifier, the reset circuitry resetting the input voltage to the switching threshold voltage level; and
      offset circuitry coupled to the input of the binary amplifier, the offset circuitry adjusting the input voltage by the offset voltage amount after the reset circuitry resets the input voltage to the switching threshold voltage level.

20. The integrated-circuit image sensor of claim 19, wherein the reset circuitry comprises a transistor coupled to the input of the binary amplifier and the output of the binary amplifier.

* * * * *